United States Patent
Muth et al.

(10) Patent No.: US 7,141,986 B2
(45) Date of Patent: Nov. 28, 2006

(54) USING TIME DOMAIN REFLECTOMETRY TO DETECT MISMATCHED CABLE/CONNECTOR INTERFACE

(75) Inventors: James M. Muth, Santa Ana, CA (US); Peiqing Wang, Irvine, CA (US); Manolito M. Catalasan, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/902,870

(22) Filed: Aug. 2, 2004

(65) Prior Publication Data

US 2006/0022681 A1    Feb. 2, 2006

(51) Int. Cl.
    *G01R 31/02* (2006.01)
(52) U.S. Cl. .................................... 324/642; 324/538
(58) Field of Classification Search ................ 324/527, 324/534, 543, 637, 642
    See application file for complete search history.

(56) References Cited

U.S. PATENT DOCUMENTS 6,417,672 B1 *  7/2002  Chong .................... 324/520
6,420,878 B1 *  7/2002  Boorom .................. 324/533
6,629,269 B1 *  9/2003  Kahkoska ................ 714/43
7,005,861 B1 *  2/2006  Lo et al. ................. 324/533
2004/0251912 A1 * 12/2004  Pharn et al. ............ 324/534

* cited by examiner

*Primary Examiner*—Walter Benson
(74) *Attorney, Agent, or Firm*—Sterne, Kessler, Goldstein & Fox, P.L.L.C.

(57) ABSTRACT

A system for detecting connector compatibility with a time domain reflectometry (TDR) circuit on a peripheral device. A cable connects the peripheral device and a second peripheral device. A first connector is for mating to a second connector on the second peripheral device. The time domain reflectometry can be used to detect electrical compatibility of the first and second connectors. The first connector can be an RJ11 connector. The second connector can be an RJ45 connector. The first connector can be a plug, and the second connector can be a socket. The number of pins of the first and second connectors can be different. The first connector can be a telco connector, and the second connector can be an Ethernet connector. The TDR circuit can be part of the peripheral device diagnostics.

14 Claims, 6 Drawing Sheets

RJ45M (Male)
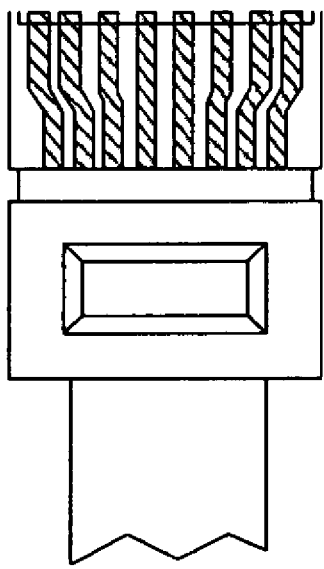
RJ45M
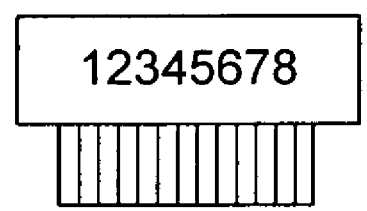
FIG. 1B
FIG. 1A

RJ11

RJ11

USING TIME DOMAIN REFLECTOMETRY TO DETECT MISMATCHED CABLE/CONNECTOR INTERFACE

BACKGROUND OF THE INVENTION

1. Field of the Invention

The present invention is related to time domain reflectometry (TDR), and more particularly, to the use of TDR for detecting mismatched connectors.

2. Related Art

Modern electronics utilize various connectors for communication between different "boxes." For example, standards, such as RS232, define physical connection standards and electrical protocols for communication between two systems. A "PHY" is a semiconductor device, or chip, that drives signals over the connection standard. Other standards govern network communications, telecommunications, and inter-device communications, such as the Ethemetor telephone systems. The telephone connector is known as "RJ11," and has up to six leads, of which two or four are typically used. Ethernet connectors, usually designated as "RJ45," have eight wires, of which typically four are used for 10/100Base-TX.

One of the problems often encountered in commercial applications is that the RJ11 will be plugged into an RJ45 socket (the male RJ11 connector will physically mate with a female RJ45 socket), even though the connectors and systems behind the connectors are otherwise electrically incompatible. This mechanical compatibility and electrical incompatibility are usually not a problem in the context of business and corporate applications, where employees of an IT department are usually knowledgeable enough not to attempt to force the RJ11 connector into an inappropriate (for example, an Ethernet) socket.

In the consumer space, however, this is often not the case. Many modern devices, such as gaming devices and broadband modems (such as cable or DSL modems) use an Ethernet connector to communicate with a desktop computer or each other. The desktop computer also frequently has an RJ11 socket for plugging in a telephone wire for a low-band-rate modem. Because many consumers are not technologically sophisticated, they often connect the wrong plug into the wrong socket. When the device does not work as advertised (which it obviously cannot, given that the connection is made to the wrong socket), the consumer becomes frustrated, and calls the technical support hotline (if any). Calls to the hotlines are frequently expensive for manufacturers, particularly for problems which are actually not hardware or software problems but simply the result of the plug being mated into the wrong socket.

Accordingly, there is a need in the art to reduce the possibility of the consumer plugging in the wrong connector into the wrong socket.

SUMMARY OF THE INVENTION

The present invention is directed to using time domain reflectometry for detecting cable/connector mismatch that substantially obviates one or more of the problems and disadvantages of the related art.

An embodiment of the present invention includes a system for detecting connector compatibility with a time domain reflectometry (TDR) circuit on a peripheral system. A cable connects two peripheral systems. A first connector is for mating to a second connector on one of the systems. The time domain reflectometry can be used to detect electrical compatibility of the first and second connectors. The first connector can be an RJ11 connector. The second connector can be an RJ45 connector. The first connector can be a plug, and the second connector can be a socket. The number of pins of the first and second connectors can be different. The first connector can be a telco connector, and the second connector can be an Ethernet connector. The TDR circuit can be part of the system diagnostics.

A method for detecting connector compatibility includes providing a time domain reflectometry (TDR) circuit on a peripheral system; connecting the peripheral system to another peripheral system using a cable; mating a first connector to a second connector on the peripheral system; using time domain reflectometry to detect electrical compatibility of the first and second connectors.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings:

FIGS. 1A and 1B illustrate an RJ45 Ethernet connector.

DETAILED DESCRIPTION OF EMBODIMENTS OF THE INVENTION

Reference will now be made in detail to the embodiments of the present invention, examples of which are illustrated in the accompanying drawings.

Time domain reflectometry (TDR) has been used in other applications to analyze the characteristics of the transmission medium. For example, in the context of Ethernet cables, time domain reflectometry can be used to detect a break in the cable, and identify the location of the break with relative precision. This is accomplished by sending out a pulse down a cable, waiting for the return signal, and analyzing the characteristics of the return signal. By measuring the duration of pulse propagation, the location of the problem can be identified. TDR is a widely used technique, and TDR components are supplied by many semiconductor vendors in the Ethernet area. For example, TDR components sold by Broadcom Corporation (Irvine, Calif.), the assignee of this application, include BCM5241 (10/100Base-TX single), 5248 (10/100Base-TX octal), 5461/5461S (10/100/1000Base-T singles), 5464, 5464R, 5464S, 5464SR, 5466R, 5466SR (all 10/100/1000Base-T quads).

The present invention adapts the concept of time domain reflectometry for detecting whether the connection of the cable from a device that is being plugged in (for example, a game console, such as Microsoft's Xbox) has been plugged into the wrong socket.

FIGS. 1A and 1B illustrate the RJ45 Ethernet connector. As shown in FIGS. 1A and 1B, the Ethernet connector has eight pins, with the pins designated as follows:

|        | Pin | Colors       |
|--------|-----|--------------|
| Pair A | 1   | White/Green  |
| Pair A | 2   | Green/White  |
| Pair B | 3   | White/Orange |
| Pair C | 4   | Blue/White   |
| Pair C | 5   | White/Blue   |
| Pair B | 6   | Orange/White |
| Pair D | 7   | White/Brown  |
| Pair D | 8   | Brown/White  |

Figure 2A:
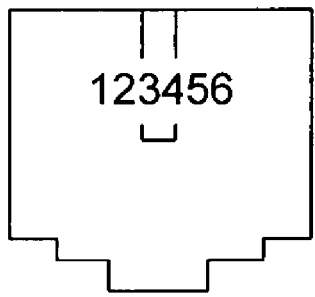
FIGS. 2A and 2B illustrate an RJ11 telephone connector.
Figure 2B:
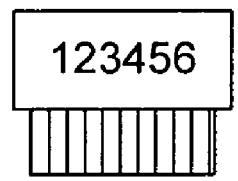

FIGS. 2A and 2B illustrate an RJ11 telephone connector, which has six pins, of which two (and sometimes four) are not used. The pin-out for the RJ11 connector is shown below:

| Pin | Colors    | Purpose  |
|-----|-----------|----------|
| 1   | White     | Not Used |
| 2   | (B)lack   | Line 2   |
| 3   | (R)ed     | Line 1   |
| 4   | (G)reen   | Line 1   |
| 5   | (Y)ellow  | Line 2   |
| 6   | Blue      | Not Used |

When an RJ11 connector is plugged into an Ethernet RJ45 socket, the pin-out correspondence is as follows:

|        | Pin | Colors       |     | Pin | Colors    | Purpose  |
|--------|-----|--------------|-----|-----|-----------|----------|
| Tip 3  | 1   | White/Green  | ↔   |     |           |          |
| Ring 3 | 2   | Green/White  | ↔   | 1   | White     | Not Used |
| Tip 2  | 3   | White/Orange | ↔   | 2   | (B)lack   | Line 2   |
| Ring 1 | 4   | Blue/White   | ↔   | 3   | (R)ed     | Line 1   |
| Tip 1  | 5   | White/Blue   | ↔   | 4   | (G)reen   | Line 1   |
| Ring 2 | 6   | Orange/White | ↔   | 5   | (Y)ellow  | Line 2   |
| Tip 4  | 7   | White/Brown  | ↔   | 6   | Blue      | Not Used |
| Ring 4 | 8   | Brown/White  |     |     |           |          |

Obviously, despite the mechanical compatibility of the two connectors, an Ethernet device would not work when plugged into an RJ11 socket, and vice-versa.

Thus, TDR can be used to identify where exactly the problem is when an RJ11 plug is inserted into an RJ45 socket. For example, TDR, when performed in the system with the RJ45 socket (see 401 in FIG. 4), can identify whether the problem is at the output of the system 401, at the input to a Cable/DSL modem 404, or somewhere in between. The system 401 can have a diagnostics mode, which can be activated by the consumer or on as default, which will identify for the consumer where the problem exists, and suggest that the possibility of the cause of the problem is that the incorrect cable is being used to connect the system 401 to the Cable/DSL modem 404.

As may be seen from the above table, only pins 2, 3, 4 and 5 are used in the RJ11 connector. Only pins 1, 2, 3, and 6 are typically used in the RJ45 connector.

As may be seen from the table above, pin 1 on the RJ11 plug lines up with pin 2 on the RJ45 socket. Pin 2 of the RJ11 plug lines up with pin 3 of the RJ45 socket, and so forth. Note that pins 3 and 6 of the RJ45 connector line up with pins 2 and 5 of the RJ11 socket. As pins 3 and 6, Pair B of the Ethernet connector, correspond to pins 2 and 5, which are attached to a wire in a four wire RJ11 connector, TDR can detect that there is a non-zero distance on Pair B, and a zero distance on Pair A (as pins 1 and 2 of the Ethernet connector are connected to nothing and a wire of some distance, which TDR will detect as a zero distance). Even in the case of a two-wire telco connector (in other words, when only two wires of the RJ11 standard are used), the present invention can be used to detect such a configuration by muxing the TDR signals to two different pins on the RJ11 connector and analyzing their signal.

In the case of an RJ11 connector being plugged into an RJ45 socket, as shown in the table above, the PHY will see zero distance when using TDR, since pin 1 of the RJ45 socket is unconnected. On RJ45 socket pins 3 and 6, the PHY will see a non-zero distance as this corresponds to a four wire RJ11 pins 2 and 5 (Line 2). This, therefore, can be interpreted as having the wrong connector, and the customer can be informed accordingly. If an Ethernet cable connecting the system to the Cable/DSL modem has some length, (e.g., a few feet) the PHY will measure some distance, but the distance will match between Pair A and Pair B.

Figure 3A:
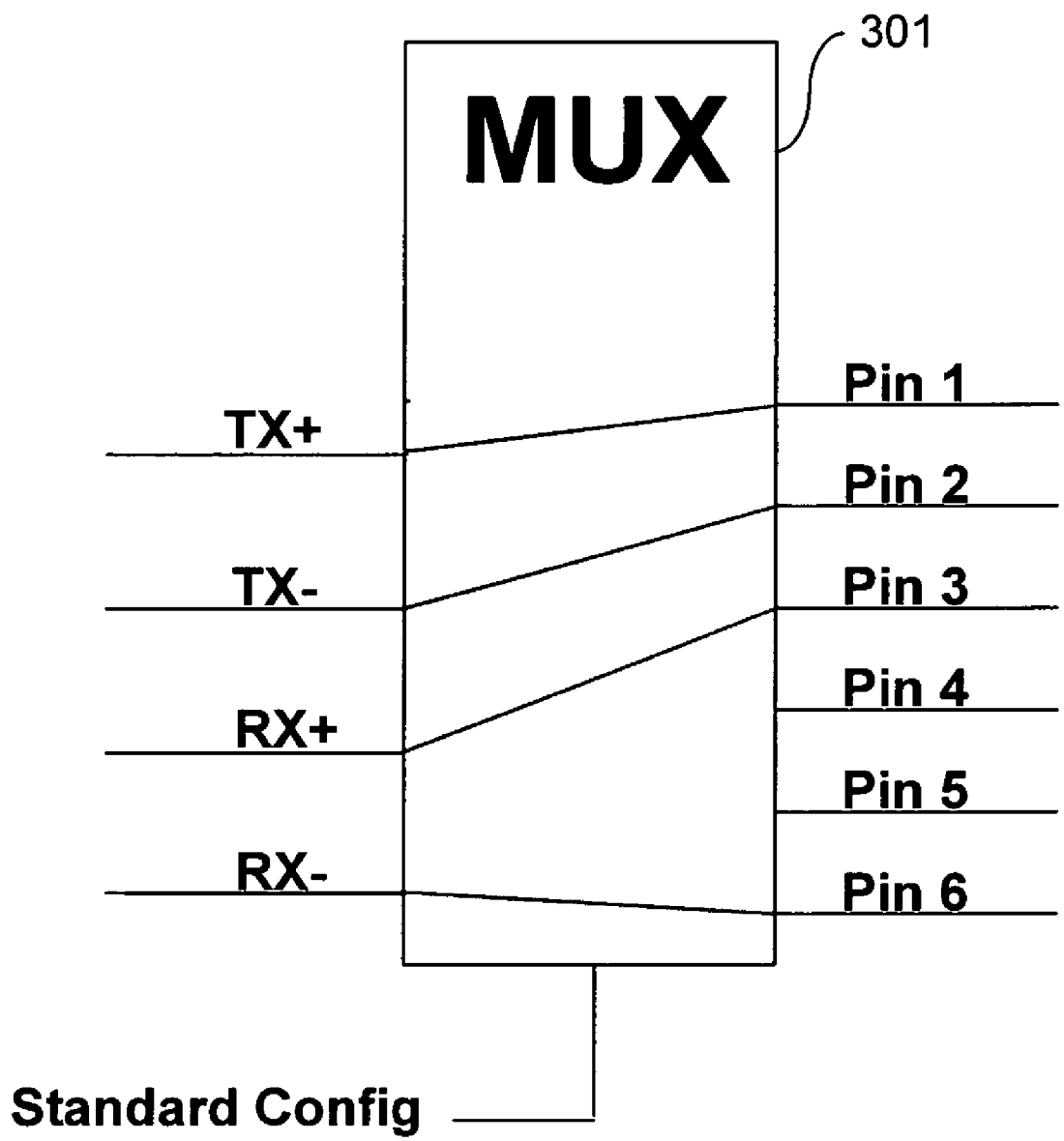
FIGS. 3A and 3B illustrate a two-wire telco connector detection.
Figure 3B:
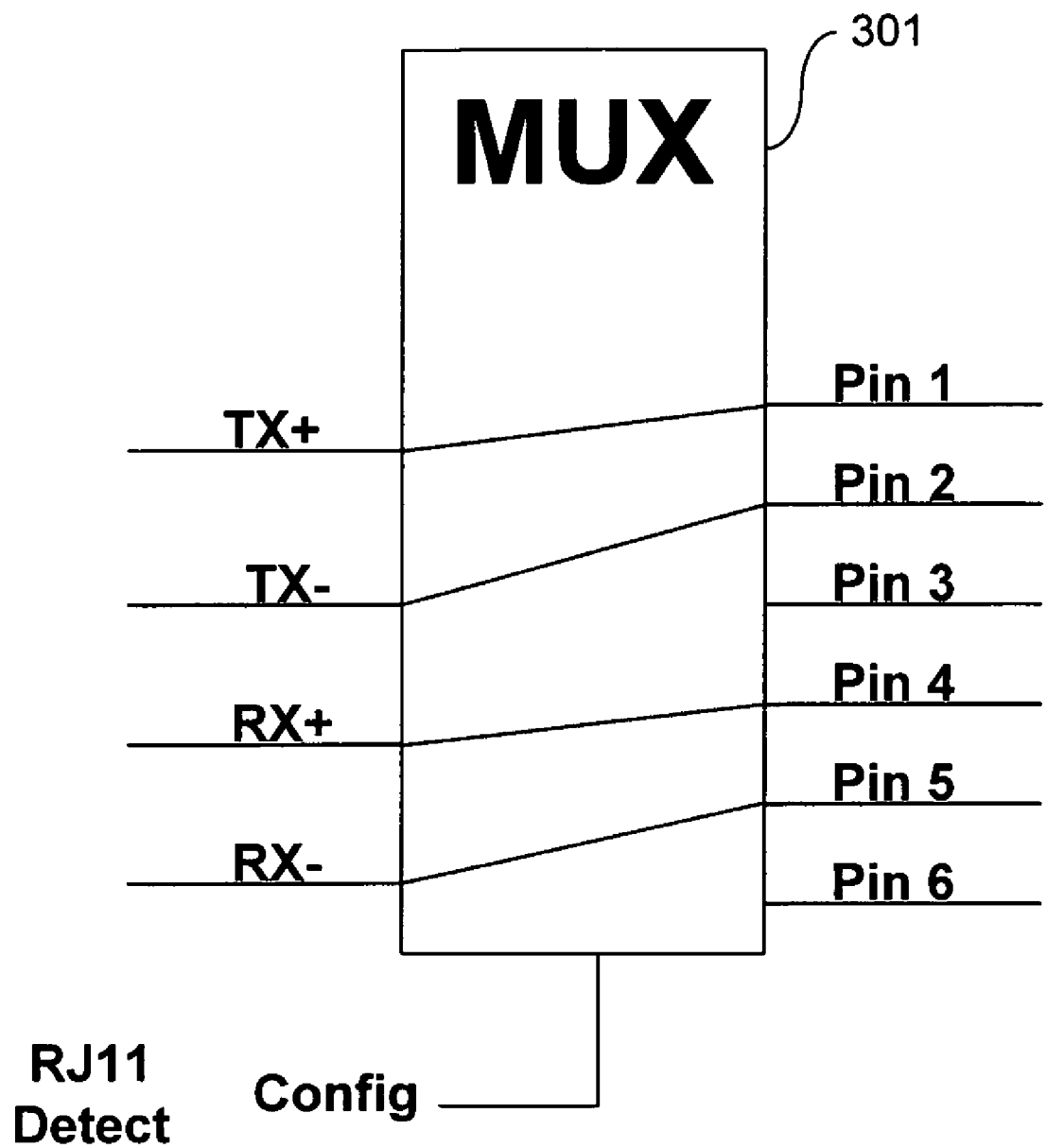

FIGS. 3A and 3B address the situation of a two-wire telco connector case, in other words, when the RJ11 cable only uses two wires. A multiplexer 301, which may be built into the PHY at the system side, is used to switch Pair B input from RJ45 socket pins 3 and 6 to RJ45 socket pins 4 and 5, which correspond to RJ11 pins 3 and 4 (Line 1) in the case of an incorrect two wire RJ11 being plugged into the RJ45 socket. This may be done internal to the interface chip of the system, or external to the interface chip.

Figure 4:
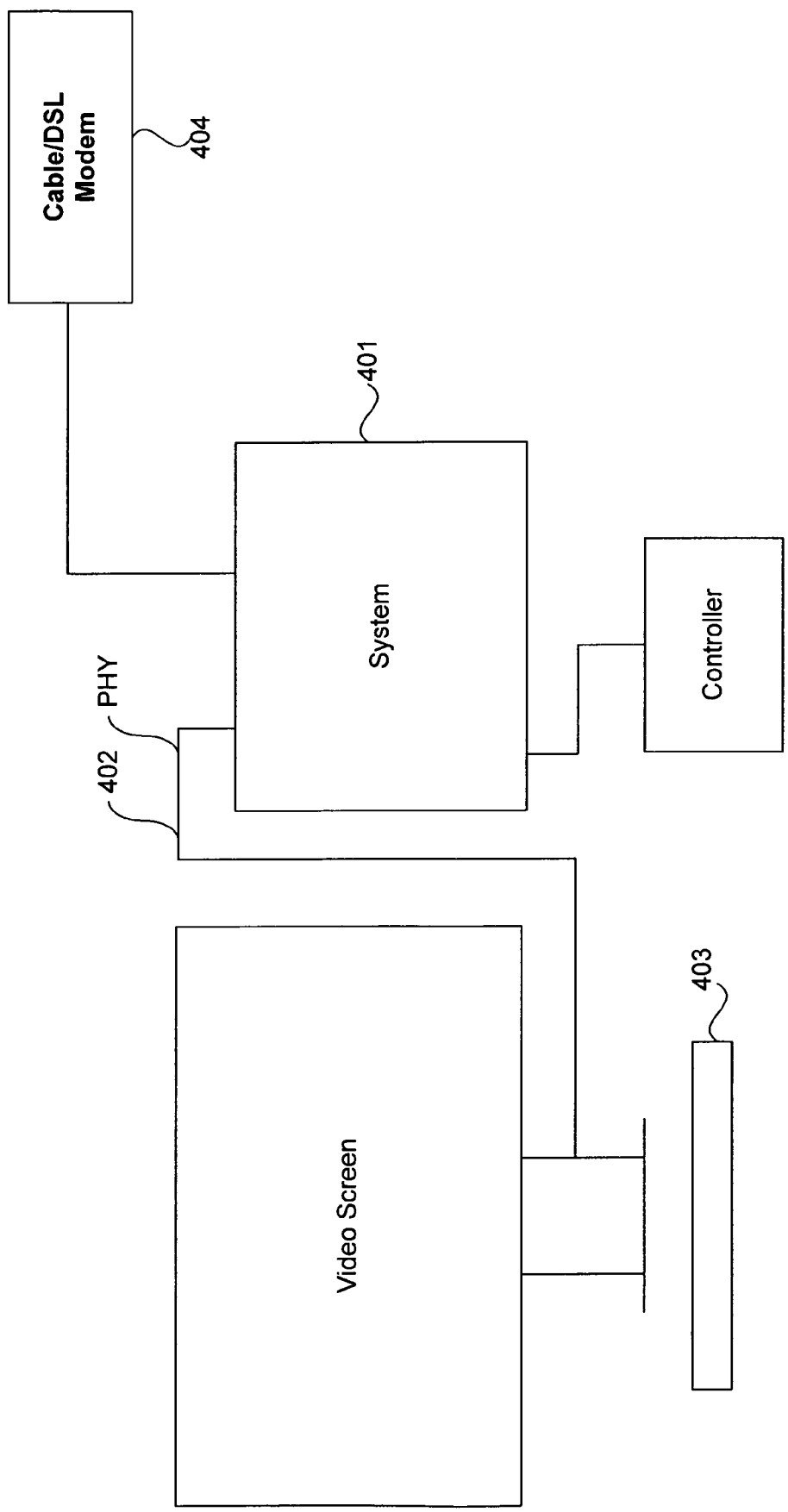
FIG. 4 illustrates a device setup where the present invention may be used.

FIG. 4 illustrates the device setup. The TDR circuit may be located within the peripheral device (system) 401 (here, an XBOX). An Ethernet cable 402 connects the peripheral device 401 to the Cable/DSL modem 404. The present invention thus may be used to identify mismatched connectors on the peripheral device 401, any breaks in the Ethernet cable 402, whether or not device 404 is turned on, and the user can be informed accordingly.

Figure 5:
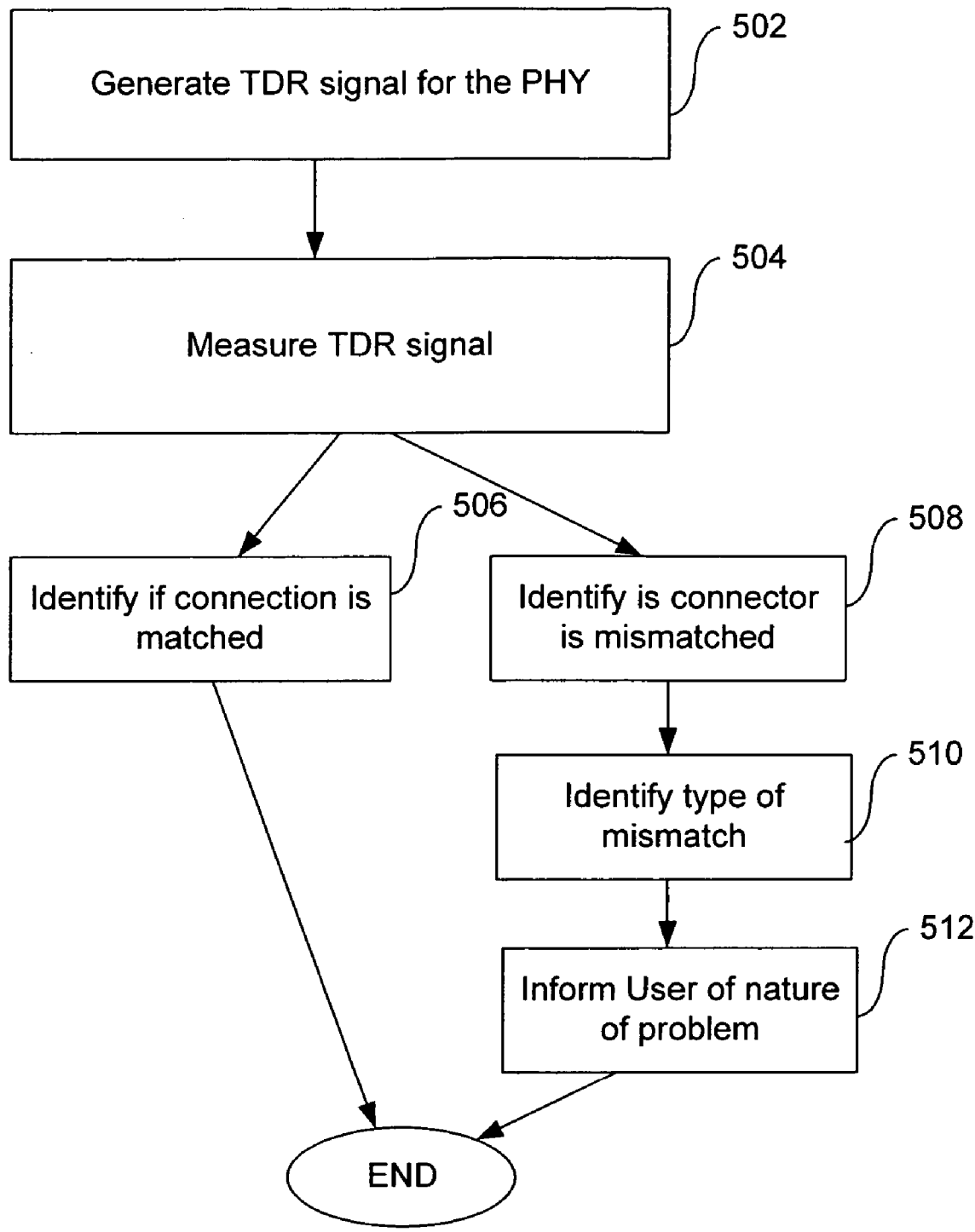
FIG. 5 illustrates a flow chart of how the present invention may be used.

FIG. 5 illustrates a flow chart of how the present invention may be used. As shown in FIG. 5, a pulse (TDR signal) is generated by the PHY chip in the peripheral device 401 (or optionally by some other mechanism in the peripheral device 401) (step 502). The reflected pulse is received and analyzed (step 504). The connection is identified as matched (step 506) or mismatched (step 508). The type of mismatch (e.g., RJ11 plugged into an RJ45 socket) is identified (e.g., by using the multiplexer 301) (step 510). The user is informed of the nature of the problem, for example, on a computer screen, TV screen, or other monitor, or on the system 401 (step 512). The process then terminates.

Although the present invention has been described above primarily with reference to the RJ11/RJ45 mis-connection, the invention is not limited to this application. The invention is applicable to any types of connectors where it is possible to connect the two connectors mechanically, but where the connectors are electrically incompatible with each other.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A system for detecting connector compatibility comprising:
   first and second peripheral devices, the first peripheral device generating a plurality of output signals;
   a time domain reflectometry (TDR) circuit on the first peripheral device;
   a cable connecting the first peripheral device and the second peripheral device; and
   a first connector on the cable for mating to a second connector on the second peripheral device;
   wherein the time domain reflectometry circuit is used to detect electrical compatibility of the first and second connectors; and
   wherein the first peripheral device includes a multiplexer configured to swap two or more signals of the plurality of output signals, responsive to an incompatibility detected by the time domain reflectometry circuit.

2. The system of claim 1, wherein the first connector is an RJ11 connector.

3. The system of claim 1, wherein the second connector is an RJ45 connector.

4. The system of claim 1, wherein the first connector is a plug, and the second connector is a socket.

5. The system of claim 1, wherein a number of pins of the first and second connectors is different.

6. The system of claim 1, wherein the first connector is a telco connector, and the second connector is an Ethernet connector.

7. The system of claim 1, wherein the TDR circuit is part of the first peripheral device diagnostics.

8. A method for detecting connector compatibility comprising:
   providing a time domain reflectometry (TDR) circuit on a first peripheral device, the first peripheral device generating a plurality of output signals;
   connecting the first peripheral device and a second peripheral device using a cable;
   mating a first connector on the cable to a second connector on the second peripheral device;
   using time domain reflectometry to detect electrical compatibility of the first and second connectors; and
   swapping two or more output signals from first peripheral device responsive to an incompatibility detected at output of said TDR circuit.

9. The method of claim 8, wherein the first connector is an RJ11 connector.

10. The method of claim 8, wherein the second connector is an RJ45 connector.

11. The method of claim 8, wherein the first connector is a plug, and the second connector is a socket.

12. The method of claim 8, wherein a number of pins of the first and second connectors is different.

13. The method of claim 8, wherein the first connector is a telco connector, and the second connector is an Ethernet connector.

14. The method of claim 8, wherein the TDR circuit is part of the first peripheral device diagnostics.

* * * * *